US012681381B2

(12) United States Patent

Yoshimura et al.

(10) Patent No.: US 12,681,381 B2

(45) Date of Patent: Jul. 14, 2026

(54) PELLICLE, EXPOSURE MASTER, EXPOSURE DEVICE, PELLICLE PRODUCTION METHOD AND TEST METHOD FOR MASK ADHESIVE LAYER

(71) Applicant: Mitsui Chemicals, Inc., Tokyo (JP)

(72) Inventors: Yutaka Yoshimura, Tokyo (JP); Keiichi Kakihara, Tokyo (JP); Ryo Tanaka, Tokyo (JP); Yuji Maruyama, Tokyo (JP); Masatsugu Higashi, Tokyo (JP); Masakazu Yamauchi, Tokyo (JP); Tomokazu Tanaka, Tokyo (JP)

(73) Assignee: MITSUI CHEMICALS, INC., Tokyo (JP)

( * ) Notice: Subject to any disclaimer, the term of this patent is extended or adjusted under 35 U.S.C. 154(b) by 119 days.

(21) Appl. No.: 18/727,572

(22) PCT Filed: Jan. 26, 2023

(86) PCT No.: PCT/JP2023/002458

§ 371 (c)(1),
(2) Date: Jul. 9, 2024

(87) PCT Pub. No.: WO2023/149343

PCT Pub. Date: Aug. 10, 2023

(65) Prior Publication Data

US 2025/0093767 A1      Mar. 20, 2025

(30) Foreign Application Priority Data

Feb. 4, 2022    (JP) ................................. 2022-016697

(51) Int. Cl.
*G03F 1/62*      (2012.01)
*G03F 7/00*      (2006.01)

(52) U.S. Cl.
CPC ............ *G03F 1/62* (2013.01); *G03F 7/70983* (2013.01)

(58) Field of Classification Search
CPC .......... G03F 1/62; G03F 7/70983; G03F 1/64; G03F 1/84; G03F 7/2004; C09J 11/06; C09J 133/066
See application file for complete search history.

(56) References Cited

U.S. PATENT DOCUMENTS 8,945,799 B2 * 2/2015 Taneichi ................. C08L 57/02
                                             430/5
9,310,673 B2 * 4/2016 Yano ......................... G03F 1/64
(Continued)

FOREIGN PATENT DOCUMENTS

JP       2007156397 A     6/2007
JP       2016167070 A     9/2016
(Continued)

OTHER PUBLICATIONS

International Preliminary Report on Patentability (Form PCT/IB/373) and the Written Opinion of the International Searching Authority (Form PCT/ISA/237) issued on Aug. 6, 2024, by the International Bureau of WIPO, in corresponding International Application No. PCT/JP2023/002458. (8 pages).
(Continued)

*Primary Examiner* — Hung V Nguyen
(74) *Attorney, Agent, or Firm* — BUCHANAN INGERSOLL & ROONEY PC

(57) ABSTRACT

Provided is a pellicle, including a frame on which a pellicle film is placed and a mask adhesive layer which is placed on the frame, wherein when an attachment portion S1 of the adhesive layer to a quartz mask is irradiated with xenon (Xe) excimer lamp light from a back surface of the mask for 2 minutes and the pellicle is then peeled off, a residual ratio (residual area of the adhesive layer on a quartz mask/area of (Continued)

the attachment portion S1 of the adhesive layer) of the adhesive layer is 0.001 to 5.0%.

14 Claims, 2 Drawing Sheets

(56)                    References Cited

U.S. PATENT DOCUMENTS

| | | | | |
|---|---|---|---|---|
| 11,454,881 B2 * | 9/2022 | Lin | .................... | G03F 7/70733 |
| 11,478,828 B2 * | 10/2022 | Park | .......................... | G03F 1/82 |
| 12,258,494 B2 * | 3/2025 | Kim | ......................... | C09J 11/06 |
| 12,265,324 B2 * | 4/2025 | Hamada | .................... | G03F 7/20 |
| 2006/0257754 A1 | 11/2006 | Harubayashi et al. | | |
| 2022/0214611 A1 | 7/2022 | Hamada et al. | | |

FOREIGN PATENT DOCUMENTS

| | | | |
|---|---|---|---|
| JP | 2017090719 A | 5/2017 |
| JP | 2020160466 A | 10/2020 |
| JP | 2020194182 A | 12/2020 |

OTHER PUBLICATIONS

International Search Report (PCT/ISA/210) with English translation and Written Opinion (PCT/ISA/237) mailed on Apr. 18, 2023, by the Japanese Patent Office as the International Searching Authority for International Application No. PCT/JP2023/002458, 8 pgs.

* cited by examiner

Fig. 1
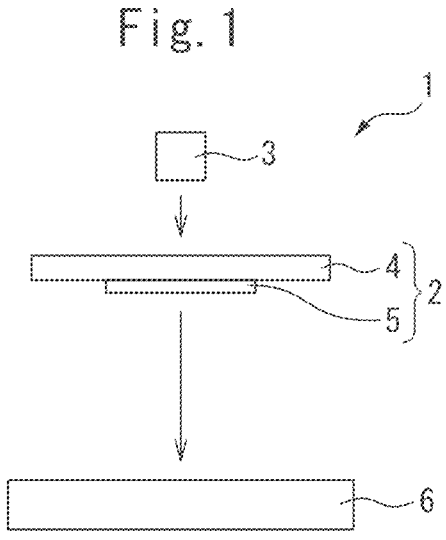
Fig. 2A
Fig. 2B
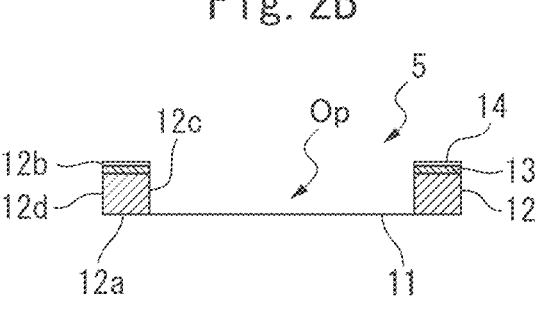

PELLICLE, EXPOSURE MASTER, EXPOSURE DEVICE, PELLICLE PRODUCTION METHOD AND TEST METHOD FOR MASK ADHESIVE LAYER

FIELD

The present invention relates to a pellicle, an exposure master, and an exposure device, as well as a pellicle production method and a test method for a mask adhesive layer.

BACKGROUND

In lithographic step for producing electronic components, pellicles are sometimes used to protect photomasks from dust. A pellicle includes a frame on which a pellicle film is placed, and a mask adhesive layer which is placed on the frame, and is attached to a photomask via the mask adhesive layer.

When the mask adhesive layer receives stray light during exposure, it tends to react with the surface of the photomask, and as a result, the adhesion thereof to the photomask tends to increase. In this case, even when the pellicle has been peeled off from the photomask, there is a risk that the adhesive of the mask adhesive layer may remain on the photomask, resulting in so-called "adhesive residue." In recent years, as the wavelength of exposure light has become shorter, the frequency of replacing photomasks has increased, and under these circumstances, a pellicle which can easily reduce adhesive residue is desired.

There has been proposed a pellicle one of which objects is to reduce adhesive residue (refer to Patent Literature 1). Patent Literature 1 proposes controlling the content of carboxylic acid-containing monomer units in a mask adhesive layer to 0.9% by mass or less based on 100% by mass of a (meth)acrylic acid alkyl ester copolymer.

CITATION LIST

Patent Literature

[PTL 1] Japanese Unexamined Patent Publication (Kokai) No. 2017-90719

SUMMARY

Technical Problem

However, there is a background in which a further reduction in adhesive residue is required than the reduction in the adhesive residue achieved by the technique described in Patent Literature 1. By further reducing adhesive residue, it is expected that the photomask replacement operation will become even more efficient.

Furthermore, since the deterioration behavior of a pellicle differs between heating and light irradiation, there is a background in which studies are expected to be conducted on adhesive residue evaluation as described in Patent Literature 1.

Under the circumstances where it is necessary that patterns formed by lithographic step have higher and higher definition, distortion of photomasks, or "mask distortion", has become a problem. Though it is often advantageous to reduce the flexibility of the mask adhesive layer from the viewpoint of preventing the adhesive residue described above, a mask adhesive layer having reduced flexibility is considered to be more likely to cause mask distortion. The mask adhesive layer attached to the photomask is said to be one of the causes of mask distortion. Reducing mask distortion caused by the mask adhesive layer is expected to further improve the efficiency of mask replacement operations.

The present invention has been conceived in light of the circumstances described above. An object of the present invention is to provide a pellicle with which the efficiency of photomask replacement operations can be further improved.

Another object of the present invention is to provide an exposure master and an exposure device using the above pellicle, a method for the production of the pellicle, and a test method for a mask adhesive layer.

Solution to Problem

Examples of embodiments according to the present invention are as described below.

[1]

A pellicle, comprising a frame on which a pellicle film is placed and a mask adhesive layer which is placed on the frame, wherein when an attachment portion of the adhesive layer to a quartz mask is irradiated with xenon (Xe) excimer lamp light from a back surface of the mask for 2 minutes and the pellicle is then peeled off, a residual ratio (residual area of the adhesive layer on the mask/area of the attachment portion of the adhesive layer) of the adhesive layer is 0.001 to 5.0%.

[2]

The pellicle according to Item 1, wherein the residual ratio when the attachment portion is irradiated with xenon (Xe) excimer lamp light from the back surface of the mask for 2 minutes and the pellicle is then peeled off is 5.0% or less.

[3]

The pellicle according to Item 1 or 2, wherein the residual ratio is 2.0% or less.

[4]

The pellicle according to any one of Items 1 to 3, wherein when a tension is applied to the adhesive layer in a longitudinal direction at an elongation of 20% and thereafter the tension is kept, and 3 minutes has elapsed, a residual stress value per unit cross-sectional area is greater than 0 and 10 mN/mm$^2$ or less.

[5]

The pellicle according to any one of Items 1 to 4, wherein the adhesive layer comprises:

a reaction product of a (meth)acrylic copolymer and a curing agent having a crosslinking density-ensuring unit and a flexibility-imparting unit.

[6]

The pellicle according to Item 5, wherein the (meth)acrylic copolymer contains a hydroxyl group-containing monomer, and a ratio of the hydroxyl group-containing monomer to a total amount of the (meth)acrylic copolymer is 4.0% by mass or less.

[7]

The pellicle according to Item 5, wherein the crosslinking density-ensuring unit contains three or more isocyanate groups, and the flexibility-imparting unit contains an aliphatic isocyanate compound containing an isocyanate group located at an end of an alkyl chain having 4 or more carbon atoms.

[8]

The pellicle according to Item 5 or 6, wherein 95% by mass or more of the curing agent is an aliphatic isocyanate compound.

[9]

The pellicle according to any one of Items 5 to 8, wherein less than 5% by mass of the curing agent is an aromatic isocyanate compound.

The pellicle according to any one of Items 5 to 9, wherein a ratio of the curing agent to a total amount of the (meth) acrylic copolymer is 0.20 to 3.00% by mass.

An exposure master comprising a quartz mask and the pellicle according to any one of Items 1 to 10 mounted to the mask.

An exposure device, comprising:

a light source for emitting xenon (Xe) excimer lamp light, and the exposure master according to Item 11, which is irradiated with the xenon (Xe) excimer lamp light.

A method for the production of a pellicle comprising a frame on which a pellicle film is placed and a mask adhesive layer which is placed on the frame, wherein when an attachment portion of the adhesive layer to a quartz mask is irradiated with xenon (Xe) excimer lamp light from a back surface of the mask for 2 minutes and the pellicle is then peeled off, a residual ratio (residual area of the adhesive layer on the mask/area of the attachment portion of the adhesive layer) of the adhesive layer is 0.001 to 5.0%.

A test method for a mask adhesive layer, using a pellicle comprising a frame on which a pellicle film is placed and a mask adhesive layer which is placed on the frame, wherein a value based on a residual ratio (residual area of the adhesive layer on a quartz mask/area of an attachment portion of the adhesive layer to the mask) of the adhesive layer is compared with a predetermined threshold value.

A pellicle, comprising a frame on which a pellicle film is placed and a mask adhesive layer which is placed on the frame, wherein when an attachment portion of the adhesive layer to a quartz mask is irradiated with xenon (Xe) excimer lamp light from a back surface of the mask at a cumulative radiation dose of 6.0 $J/cm^2$ and the pellicle is then peeled off, a residual ratio (residual area of the adhesive layer on the mask/area of the attachment portion of the adhesive layer) of the adhesive layer is 0.001 to 5.0%.

Advantageous Effects of Invention

According to the present invention, there can be provided a pellicle with which the efficiency of photomask replacement operation can further be improved by reducing adhesive residue and reducing mask distortion caused by the mask adhesive layer. Furthermore, according to the present invention, there can be provided an exposure master and an exposure device using the pellicle described above, as well as a method for the production of the pellicle and a test method for a mask adhesive layer.

BRIEF DESCRIPTION OF DRAWINGS

FIG. 1 is a view showing a configuration example of an exposure device and an exposure master according to the present embodiment.

FIGS. 2A and 2B are a view showing a configuration example of a pellicle according to the present embodiment.

DESCRIPTION OF EMBODIMENTS

Figure 3A:
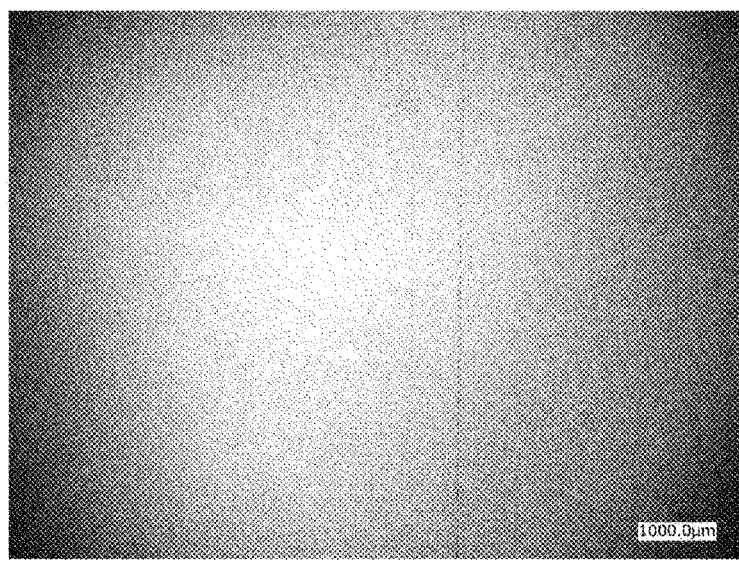
FIGS. 3A and 3B are a microscope image detailing the adhesive residue in the Examples and Comparative Examples.

Embodiments of the present invention (hereinafter referred to as the "present embodiment") will be described below. In the present embodiment, numerical ranges described using "to" represent numerical ranges including the numerical values before and after "to." In the present embodiment, the upper limit or lower limit described in a certain numerical range can be replaced with the upper limit or lower limit of another numerical range. In the present embodiment, the upper limit value or lower limit value described in a certain numerical range can be replaced with the values shown in the Examples. In the present embodiment, the term "step" includes not only independent steps but also steps which cannot be clearly distinguished from other steps, as long as the function of the step is achieved. The scale, shape, and length of each part in the drawings may be exaggerated for added clarity.

[Exposure Device and Exposure Master]

FIG. 1 is a schematic view showing a configuration example of an exposure device 1 and an exposure master 2 according to the present embodiment. As shown in the drawing, the exposure device 1 comprises a light source 3 for emitting light and the exposure master 2, which is irradiated with the light, wherein the exposure master 2 comprises a photomask 4 and a pellicle 5 mounted to the photomask 4.

The light emitted from the light source 3 is Xe excimer lamp light, and the photomask 4 is made of quartz. Hereinafter, a photomask composed of quartz may be referred to as a quartz mask.

The pellicle 5 is attached to the photomask 4 so as to cover a circuit pattern (not illustrated) formed on the photomask 4. The pellicle 5 functions as a dustproof cover for the photomask 4. In the exposure device 1, the light emitted from light source 3 (the arrow in FIG. 1) passes through the circuit pattern of the photomask 4, further transmits through the pellicle film of the pellicle 5, and is guided to the photoresist (not illustrated) on a stage 6.

Since the exposure device 1 and the exposure master 2 include the pellicle 5 according to the present embodiment, it is possible to achieve both a reduction in adhesive residue and a reduction in mask distortion caused by the mask adhesive layer, and as a result, it is possible to further improve the efficiency of the photomask 4 replacement operation.

[Pellicle]

[Schematic Configuration]

FIGS. 2A and 2B are views showing a configuration example of the pellicle 5 according to the present embodiment. As illustrated, the pellicle 5 comprises a frame 12 on which a pellicle film 11 is placed, and a mask adhesive layer (hereinafter sometimes simply referred to as "adhesive layer") 13 placed on the frame 12. In the pellicle 5, the residual ratio of the adhesive layer 13 when an attachment portion S1 of the adhesive layer 13 to a photomask 4 is irradiated with Xe excimer lamp light from a back surface of the photomask 4 for 2 minutes and the pellicle 5 is then peeled off is 0.001 to 5.0%.

According to the above configuration, it is possible to achieve both a reduction in adhesive residue and a reduction in mask distortion caused by the adhesive layer 13, and as a result, it is possible to further improve the efficiency of the photomask 4 replacement operation.

[Frame]

The frame 12 is a member for supporting the pellicle film 11. The frame 12 comprises a pair of sides 12A and a pair of sides 12B. The sides 12A may be the long sides, and the sides 12B may be the short sides. These long sides 12A and short sides 12B form a rectangular outer shape, and a rectangular opening Op is formed inside the outer shape.

Both the long sides 12A and the short sides 12B have a substantially rectangular parallelepiped shape. The long sides 12A and the short sides 12B each have four faces (one face 12a, the other face 12b opposite to the one face 12a, an inner circumferential face 12c, and an outer circumferential face 12d opposite to the inner circumferential face 12c). The one face 12a includes the area where the pellicle film 11 is attached, and the other face 12b includes the area where the adhesive layer 13 is formed.

The length of the long sides 12A is, for example, 50 mm or more, 80 mm or more, or 100 mm or more, and 200 mm or less, 180 mm or less, or 160 mm or less. The length of the short sides 12B is 30 mm or more, 50 mm or more, or 80 mm or more, and 180 mm or less, 160 mm or less, or 140 mm or less. According to the lengths of the long sides 12A and/or the short sides 12B, it is easy to prevent the pellicle film 11 from sagging, and it is also easy to surround the circuit pattern formed on the photomask 4.

However, the configuration of the frame 12 (length, width, thickness, shape, etc.) can be arbitrarily changed in accordance with the configuration of the pellicle film 11, the size of the circuit pattern formed on the photomask 4, etc. The frame 12 may be configured integrally or may be configured so as to be divisible.

The frame 12 can be formed of known materials, such as:

aluminum;

aluminum alloys (for example, 5000 series, 6000 series, 7000 series, etc.);

steel;

stainless steel;

magnesium alloys;

ceramics such as silicon carbide (SiC), aluminum nitride (AlN), and aluminum oxide ($Al_2O_3$);

composite materials of a ceramic and a metal (for example, Al—SiC, Al—AlN, Al—$Al_2O_3$, etc.);

engineered plastics using polyethylene (PE), polyamide (PA), polycarbonate (PC), or polyetheretherketone (PEEK);

fiber composite materials such as glass fiber reinforced plastic (GFRP) and carbon fiber reinforced plastic (CFRP); or combinations of these.

The inner circumferential face 12c of the frame 12 may include an adhesive component for trapping foreign matter, if necessary. Examples of the adhesive component include:

acrylic-based, vinyl acetate-based, silicone-based, and rubber-based adhesives; and silicone-based or fluorine-based grease.

[Pellicle Film]

The pellicle film 11 is a transparent thin film. The pellicle film 11 covers the opening Op. The pellicle film 11 is attached onto the one face 12a of the frame 12 with a pellicle film adhesive (not illustrated) under a certain amount of tension so as not to sag excessively due to the weight of the film itself.

The pellicle film 11 can be formed from nitrocellulose, cellulose derivatives, or fluorine polymers. From the viewpoints of transmittance of light emitted from the light source, light resistance to such light, and self-supporting property of the pellicle film 11 itself, the thickness of the pellicle film 11 is, for example, 10 μm or less. It is preferably 5 μm or less, and more preferably 1 μm or less.

[Protective Film]

The pellicle 5 may include a protective film 14 (liner) laminated on the adhesive layer 13. The protective film 14 protects the adhesive layer 13 during storage or transportation of the pellicle 5, and is peeled off from the adhesive layer 13 when the pellicle 5 is mounted to the photomask 4.

The protective film 14 can be formed of resin such as polyester, and has a thickness of, for example, 30 to 200 μm. The protective film 14 may have a silicone layer or a fluorine layer on the surface in contact with the adhesive layer 13 to improve peelability.

[Mask Adhesive Layer]

<Schematic Configuration>

The adhesive layer 13 is a member for attaching the frame 12 to the photomask 4. The adhesive layer 13 can be placed on the other face 12b of the frame 12.

In the pellicle 5, the residual ratio of the adhesive layer 13 when the attachment portion S1 of the adhesive layer 13 to the photomask 4 is irradiated with Xe excimer lamp light for 2 minutes from the back surface of the photomask 4 and the pellicle 5 is then peeled off is 0.001 to 5.0%. The residual ratio is calculated by the following formula:

$$\text{Residual ratio} = (\text{residual area of adhesive layer 13 on photomask 4})/(\text{area of attachment portion S1 of adhesive layer 13})$$

For example, if the adhesive layer 13 remains in approximately 10% of the area of the attachment portion S1 of the adhesive layer 13, the residual ratio is expected to be approximately 10%, at least 5.0%.

By setting the residual ratio of the adhesive layer 13 to 5.0% or less, the operation of removing the adhesive layer 13 remaining on the photomask 4 can be shortened in time and/or simplified, thereby reducing the effort required for the removal operation. If the residual ratio is sufficiently small, the removal operation itself can be omitted. Based on the above, it is expected that the photomask 4 replacement operation will become even more efficient. From the same viewpoint, the residual ratio is preferably 2.0% or less, 1.5% or less, or 1.0% or less.

Conversely, when the residual ratio of the adhesive layer 13 is less than 0.001%, the flexibility of the mask adhesive layer is extremely low, and specifically, the mask adhesive layer is often hard, and in this case, mask distortion is likely to occur. Thus, by setting the residual ratio of the adhesive layer 13 to 0.001% or more, it is possible to reduce mask distortion caused by the adhesive layer 13, thereby making it easier to suitably reuse the photomask 4, and therefore, it is expected that the photomask 4 replacement operation will be made more efficient.

The "area of the attachment portion of the mask adhesive layer" corresponds to the area of the attachment portion S1 of the adhesive layer 13 to the photomask 4 when the adhesive layer 13 is attached to the photomask 4 in FIGS. 2A and 2B. The area of the portion S1 can correspond to the area of the contact portion between the photomask 4 and the adhesive layer 13. When the adhesive layer 13 is placed on the entire surface of the other face 12b of the frame 12, the area of the portion S1 can correspond to the area of the entire surface of the other face 12b.

The "back surface of the photomask" in FIGS. 2A and 2B corresponds to the surface of the photomask 4 opposite to the surface to which the adhesive layer 13 is attached. Using an exposure device 1 as shown in FIG. 1, Xe excimer lamp light is emitted for 2 minutes under a normal environment and normal operation in accordance with an actual lithography step. The pellicle 5 is then peeled off from the photomask 4 under a normal environment and under normal operation in accordance with an actual lithography step. "When . . . is irradiated with Xe excimer lamp light from the back surface of the photomask for 2 minutes and then pellicle is peeled off" is realized by means of the foregoing. Note that peeling can be performed by pulling up the pellicle 5 perpendicularly to the photomask 4 at a rate of 1 to 10 mm/min using a known tensile testing machine.

The "residual area of the mask adhesive layer on the photomask" corresponds to the area of the adhesive layer 13 remaining on the photomask 4 after the peeling described above. The residual area described above is also understood as a so-called "adhesive residue area." This residual area, for example, can be roughly calculated visually and can be calculated in more detail by image analysis of the photomask 4.

The irradiation time of the Xe excimer lamp light is 2 minutes. The longer the irradiation time with the Xe excimer lamp light, the more easily the adhesive layer 13 is to be cured, and thus, the easier it is to reduce adhesive residue. In the pellicle 5 according to the present embodiment, the adhesive layer 13 can reduce both adhesive residue and mask distortion caused by the adhesive layer 13 even when a short irradiation time of 2 minutes is selected for the Xe excimer lamp light irradiation time.

When a tension is applied to the adhesive layer 13 in the longitudinal direction at an elongation of 20% and thereafter the tension is kept, and 3 minutes have elapsed, the residual stress value per unit cross-sectional area of the adhesive layer 13 is preferably greater than 0 and 10.0 $mN/mm^2$ or less. An adhesive layer 13 having a residual stress value of greater than 0, and more preferably greater than 1.0 $mN/mm^2$, is less likely to cause cohesion failure, and thus, is more likely to reduce adhesive residue. An adhesive layer 13 having a residual stress value of 10.0 $mN/mm^2$ or less does not have a strong adhesive force with the photomask 4, and thus, is more likely to reduce adhesive residue. An adhesive layer 13 having a residual stress value of 10.0 $mN/mm^2$ or less can easily reduce mask distortion caused by the adhesive layer 13. Mask distortion can more easily be reduced when the residual stress value is preferably 8.0 $mN/mm^2$ or less, more preferably 6.0 $mN/mm^2$ or less, and further preferably 5.0 $mN/mm^2$ or less. The "an elongation of 20%" as used herein can be clarified by the following formula:

$$\text{Elongation of } 20\% = \{(\text{length of mask adhesive layer after tension} - \text{length of mask adhesive layer before tension})/\text{length of mask adhesive layer before tension}\} \times 100$$

The thickness of the adhesive layer 13 may be, for example, 0.15 to 3.0 mm, and can be appropriately selected depending on the field and/or application of the final product realized through the lithographic step. When performing lithography for obtaining a semiconductor device, the thickness of the adhesive layer 13 suitable for the photomask used in the lithography is, for example, 0.15 mm or more, 0.20 mm or more, or 0.25 mm or more, and 1.0 mm or less, 0.8 mm or less, or 0.7 mm or less. When performing lithography for obtaining a liquid crystal device, the thickness of the adhesive layer 13 suitable for the photomask used in the lithography is, for example, 0.80 mm or more, 1.0 mm or more, or 1.2 mm or more, and 3.0 mm or less, 2.5 mm or less, or 2.0 mm or less.

The cross-sectional direction flatness of the adhesive layer 13 may be 1 μm or more, or 2 μm or more, and may be 20 μm or less, 15 μm or less, or 13 μm or less. When the cross-sectional direction flatness of the adhesive layer 13 is 1 μm or more, even if air bubbles entrapped when attaching the pellicle 5 to the photomask 4, it becomes easy to ensure suitable passages for the escape of the air bubbles. When the cross-sectional direction flatness of the adhesive layer 13 is 20 μm or less, the load when attaching the pellicle 5 to the photomask 4 is likely to be uniformly applied to the adhesive layer 13 and, by extension, the photomask 4. Thus, when the cross-sectional direction flatness of the adhesive layer 13 is within the above range, mask distortion can easily be reduced.

The "cross-sectional direction of the mask adhesive layer" corresponds to the thickness direction of the frame 12. The cross-sectional direction flatness of the adhesive layer 13 can be derived by the following method. The cross section of the adhesive layer 13 placed on the frame 12 is observed at a plurality of arbitrary points (for example, 10 points, 12 points, 15 points, or 20 points). In each cross section, the difference between the maximum thickness and the minimum thickness (height difference) is determined. The average value of the height differences obtained by the number of the plurality of points is then determined. This average value corresponds to the flatness described above.

The thickness and, by extension, the flatness of the adhesive layer 13, can be measured using a laser displacement meter. For a pellicle 5 having a protective film 14, the flatness may be measured after peeling off the protective film 14. If the flatness is not affected by the protective film 14, the flatness may be measured for the pellicle having the protective film 14.

The adhesive layer 13 can include, for example, a structure derived from each of:

a component (A): a primary agent having a specific functional group, and a component (B): a curing agent having reactivity with the specific functional group.

In other words, the adhesive layer 13 can be configured to include a reaction product of the component (A) and the component (B). Various physical properties of the adhesive layer 13 can be controlled by the respective types and/or ratios of the component (A) and the component (B), whereby the residual ratio can be controlled.

The adhesive layer 13 includes, for example, an acrylic copolymer. Acrylic copolymers have various physical properties that can easily be controlled, and their raw materials are also easy to procure.

The ratio of the component (A) to the total amount of the adhesive layer 13 is preferably 98.0% by mass or more, or 99.0% by mass or more, and preferably 99.9% by mass or less, or 99.8% by mass or less. When the ratio of the component (A) is within the above range, suitable adhesion of the adhesive layer 13 to the photomask 4 and appropriate peelability of the adhesive layer 13 from the photomask 4 are more likely to be exhibited.

<Component (A): Primary Agent>

The component (A) contains, for example, a (meth)acrylic copolymer, and specifically, a (meth)acrylic acid ester copolymer. In an embodiment, the (meth)acrylic ester copolymer is a copolymer of a (meth)acrylic ester and a monomer having a specific functional group. Among them, a copolymer obtained using a mixture containing 80 to 99% by mass of a (meth)acrylic acid ester and 1 to 20% by mass of a monomer having a specific functional group is preferable from the viewpoint of developing appropriate adhesion to the photomask 4.

The weight average molecular weight of the component (A) is, for example, 700,000 to 2,500,000, and in this case, the cohesive force of the adhesive layer 13 and/or the adhesive force of the adhesive layer 13 to the photomask 4 can easily be controlled to an appropriate level, and in turn, it is easy to reduce adhesive residue. From the same viewpoint as above, the weight average molecular weight of the component (A) is 900,000 or more, or 1,050,000 or more, and 2,000,000 or less, or 1,500,000 or less.

The weight average molecular weight of the component (A) tends to increase when, for example, the monomer raw material is subjected to a polymerization reaction wherein the monomer concentration is high, the amount of polymerization initiator is low, or the polymerization temperature is low. Generally, the greater the weight average molecular weight, the greater the cohesive force tends to be, and the greater the cohesive force, the greater the residual stress value tends to be.

The component (A) can be produced using a known polymerization method. Examples of such polymerization methods include radical polymerization, ionic polymerization, living polymerization, and living radical polymerization. In the polymerization, a polymerization initiator, chain transfer agent, emulsifier, etc., may be appropriately selected and used.

((Meth)Acrylic Acid Ester)

The (meth)acrylic ester has, for example, an alkyl group having 1 to 14 carbon atoms, and the alkyl group may be linear or branched. However, from the viewpoint of reducing adhesive residue and achieving suitable adhesion to the photomask 4, the alkyl group preferably has 4 to 8 carbon atoms and is linear. One (meth)acrylic acid ester can be used alone or two or more thereof may be used in combination. The (meth)acrylic acid ester means one that does not have a specific functional group as described below.

Examples of (meth)acrylic esters having a linear alkyl group include methyl (meth)acrylate, ethyl (meth)acrylate, propyl (meth)acrylate, butyl (meth)acrylate, hexyl (meth) acrylate, octyl (meth)acrylate, nonyl (meth)acrylate, decyl (meth)acrylate, and dodecyl (meth)acrylate.

Examples of (meth)acrylic acid esters having a branched alkyl group include isopropyl (meth)acrylate, isobutyl (meth)acrylate, isopentyl (meth)acrylate, 2-ethylhexyl (meth)acrylate, isooctyl (meth)acrylate, and isononyl (meth) acrylate.

(Monomer Having Specific Functional Group)

The monomer having a specific functional group can be copolymerized with the (meth)acrylic acid ester. The "specific functional group" as used herein refers to a functional group having reactivity with the component (B), such as a carboxyl group (—COOH) and/or a hydroxyl group (—OH). One monomer having a specific functional group can be used alone or two or more thereof may be used in combination.

Examples of monomers having a specific functional group include:

carboxyl group-containing monomers such as (meth) acrylic acid, itaconic acid, maleic acid, and crotonic acid; and hydroxyl group-containing monomers such as 2-hydroxyethyl (meth)acrylate, 3-hydroxypropyl (meth)acrylate, 2-hydroxypropyl (meth)acrylate, 4-hydroxybutyl (meth)acrylate, and 6-hydroxyhexyl (meth)acrylate.

The photomask 4, which is made of quartz, has a hydroxyl group on its surface. When a reaction occurs between the hydroxyl group in the photomask 4 and the carboxyl group contained in the carboxyl group-containing monomer in the adhesive layer 13, the bond between the photomask 4 and the adhesive layer 13 tends to become strong, and in this case, adhesive residue is likely to occur. Thus, the ratio of the carboxyl group-containing monomer to the total amount of the component (A) is preferably 0.9% by mass or less, 0.5% by mass or less, or 0.3% by mass or less.

When the number of crosslinks due to the reaction between the hydroxyl group contained in the hydroxyl group-containing monomer and the component (B) increases in the unit polymer length of the adhesive layer 13, since the flexibility of the polymer will be impaired, residual stress tends to increase.

Furthermore, when the number of hydroxyl groups contained in the hydroxyl group-containing monomer in the component (A) increases, the number of hydroxyl groups remaining after the reaction with the component (B) increases, and the remaining hydroxyl groups are likely to be naturally oxidized or oxidized in an exposed environment, and as a result, the formation of carboxyl groups is more likely to occur. In this case, as described above, adhesive residue is likely to occur.

Thus, though the ratio of the hydroxyl group-containing monomer to the total amount of the component (A) depends on its compatibility with the component (B), it is preferably, for example, from the viewpoint of residual stress, 10% by mass or less, more preferably 4.0% by mass or less, and further preferably 2.0% by mass or less. The lower limit of the ratio of the hydroxyl group-containing monomer is not particularly limited, and from the same viewpoint, it is preferably greater than 0% by mass, more preferably 0.5% by mass or more, and further preferably 1.0% by mass or more.

As the photomask 4, one having a chromium vapor-deposited film formed on its surface may be used. In this case, the light emitted from the light source is blocked by the chromium vapor-deposited film. This prevents a reaction between the photomask 4 and the adhesive layer 13 from being caused by such light. By controlling the ratio of the carboxyl group-containing monomer to the total amount of the component (A) as described above, it is easy to effectively reduce adhesive residue even for a photomask 4 in which the chromium vapor-deposited film is omitted.

<Component (B): Curing Agent>

The component (B) has reactivity with the specific functional group of the component (A). As the component (B), an isocyanate compound and/or an epoxy compound are preferable, and among these, an isocyanate compound is more preferable.

The ratio of the component (B) to the total amount of the component (A) is preferably 0.20 to 3.00% by mass. According to this, it is easier to achieve both a reduction in adhesive residue and a reduction in mask distortion caused by the adhesive layer 13. From the same point of view, the ratio is more preferably 0.25% by mass or more, 0.30% by mass or more, or 0.40% by mass (for example 0.400% by mass) or more, and is more preferably 2.00% by mass or less, 1.20% by mass or less, or 1.00% by mass or less.

Though the adhesive layer 13 has various properties, in an embodiment, attention can be paid to the crosslinking density and flexibility thereof. It is preferable to focus on crosslinking density and flexibility, and to realize a configuration in the adhesive layer 13 that is advantageous for each characteristic. For example, the component (B) preferably has a crosslinking density-ensuring unit and a flexibility-imparting unit. According to this, in the adhesive layer 13, it is easy to achieve both a reduction in adhesive residue and a reduction in mask distortion caused by the adhesive layer 13.

The "crosslinking density-ensuring unit" of the component (B) is a structural unit for ensuring crosslinking density in the adhesive layer 13. Since the component (B) includes a crosslinking density-ensuring unit, a structure derived from this unit is introduced into the adhesive layer 13, and as a result, the crosslinking density in the adhesive layer 13 is ensured to a suitable degree in light of the effects of the present invention.

As the crosslinking density-ensuring unit, a plurality of isocyanate groups and/or a plurality of epoxy groups are preferable, and among these, a plurality of isocyanate groups is preferable. A compound having a plurality of isocyanate groups in one molecule is referred to as, for example, a polyfunctional isocyanate compound. Examples of polyfunctional isocyanate compounds include compounds having three or more (for example, three, four, five, six, seven, or eight) isocyanate groups in one molecule.

The "flexibility-imparting unit" of the component (B) is a structural unit for imparting flexibility to the adhesive layer 13. Since the component (B) has a flexibility-imparting unit, a structure derived from this unit is introduced into the adhesive layer 13, and as a result, flexibility of the adhesive layer 13 can be imparted to a suitable degree in light of the effects of the present invention.

As the flexibility-imparting unit, an isocyanate group arranged at the end of an alkyl chain having 4 or more carbon atoms is preferable, and among these, an isocyanate group arranged at the end of an alkyl chain having 5 to 7 carbon atoms (5, 6, or 7 carbon atoms) is preferable. The alkyl chain here may be linear, branched, or cyclic.

By ensuring crosslinking density in the adhesive layer 13 and/or imparting flexibility to the adhesive layer 13 to a suitable degree in light of the effects of the present invention, it is possible to suitably prevent the adhesive layer 13 from tearing when the pellicle 5 is peeled off from the photomask 4, and the adhesive layer 13 does not become too hard to cause mask distortion. As a result, it is easy to achieve both a reduction in adhesive residue and a reduction in mask distortion caused by the adhesive layer 13, and in turn, it is easy to achieve further efficiency of the photomask 4 replacement operation.

In an embodiment, the component (B) preferably contains an aliphatic isocyanate compound. According to this, it becomes much easier to reduce adhesive residue. From the same viewpoint, it is preferable that 95% by mass or more of the component (B) be an aliphatic isocyanate compound, and in other words, it is preferable that less than 5% by mass of the component (B) be an aromatic isocyanate compound. In the component (B), the aliphatic isocyanate compound may be 97% by mass or more (the aromatic isocyanate compound may be less than 3% by mass), the aliphatic isocyanate compound may be 99% by mass or more (the aromatic isocyanate compound may be less than 1% by mass), and the aliphatic isocyanate compound may be 100% by mass. The "aliphatic isocyanate compound" refers to an isocyanate compound that does not have an aromatic ring in its molecule, or that has an aromatic ring in its molecule wherein the isocyanate group and the aromatic ring are separated by at least two atoms, and "aromatic isocyanate compound" refers to an isocyanate compound in which the isocyanate group is directly bonded to the aromatic ring or the isocyanate group is bonded to the aromatic ring via one carbon.

It is preferable that the component (B):

have an isocyanurate skeleton; and contain a reaction product of a diisocyanate and a polyol such as a diol or triol, and in particular:

have an isocyanate skeleton in which an isocyanate group is attached to the nitrogen (N) atom in the isocyanurate skeleton via an alkyl chain; or have an isocyanate skeleton in which an isocyanate group is attached via an alkyl chain to a urethane bond containing an oxygen (O) atom derived from a polyol such as a diol or triol. According to this, the crosslinking density-ensuring unit and the flexibility-imparting unit can be introduced into the adhesive layer 13 relatively easily.

To summarize the foregoing, the component (B):

by including three or more isocyanate groups, can impart sufficient crosslinking density to the adhesive layer 13, and improves cohesive force, making it easier to reduce adhesive residue; and by including an isocyanate group arranged at the end of an alkyl chain with 4 or more carbon atoms, can impart flexibility to the adhesive layer 13, and residual stress can be maintained low when the cohesive force is improved by the effect of the curing agent. As a result, it is easy to achieve both a reduction in adhesive residue and a reduction in mask distortion, and in turn, it is easy to achieve further efficiency of the photomask 4 replacement operation.

The component (B), by not including an aromatic isocyanate, makes it possible to prevent the residual stress value from increasing excessively when the cohesive force of the adhesive layer 13 is improved due to the effect of the curing agent. As a result, it is easy to achieve both a reduction in adhesive residue and a reduction in mask distortion, and in turn, it is easy to achieve further efficiency of the photomask 4 replacement operation.

Examples of the component (B) include aromatic isocyanate compounds, alicyclic isocyanate compounds, and aliphatic isocyanate compounds.

Examples of the aromatic isocyanate compound include diphenylmethane diisocyanate (MDI), tolylene diisocyanate (TDI), reaction products of diisocyanate and trimethylolpropane, and isocyanurates based on the above diisocyanate as a raw material. Examples of aromatic isocyanate compound products include Coronate L (manufactured by Tosoh Corporation), and Desmodur L75 (manufactured by Covestro Japan Co., Ltd.).

Examples of alicyclic isocyanate compounds include isophorone diisocyanate (IPDI), 1,4-bis(isocyanatomethyl)cyclohexane (hereinafter sometimes abbreviated as "hydrogenated XDI"), reaction products of the above diisocyanate and trimethylolpropane, and isocyanurate products made from the above diisocyanate as a raw material. Examples of products of alicyclic isocyanate compounds include Desmodur Z4470 (manufactured by Covestro Japan Co., Ltd.) and VESTANAT T1890E (manufactured by Evonik).

Examples of aliphatic isocyanate compounds include 1,4-diisocyanatobutane, 1,5-diisocyanatopentane, 1,6-diisocyanatohexane (hereinafter sometimes abbreviated as "HDI"), 1,9-diisocyanatononane, and 1,12-diisocyanatododecane. Among these, HDI is particularly preferably as the aliphatic diisocyanate because it is industrially easily available and has excellent weather resistance and coating film flexibility.

Examples of compounds having three or more isocyanate groups include reaction products of the above diisocyanates and polyols such as diols and triols, isocyanurates and burettes made from the above diisocyanates as raw materials.

Among the foregoing, aliphatic isocyanate compounds are preferable, among them, those containing three or more isocyanate groups are preferable in order to ensure cross-linking density, and among those containing three or more isocyanate groups, in order to keep residual stress low, it is more preferable to include isocyanurate bodies; reaction products of diisocyanate and polyols such as diols and triols; etc. Examples of aliphatic isocyanate compound products include Desmodur N3300, N3600 (manufactured by Covestro Japan Co., Ltd.), Coronate HX (manufactured by Tosoh Corporation), and Duranate TPA-100, TKA-100, MFA-75B, MHG-80B, E402-80B (manufactured by Asahi Kasei Corporation). The component (B) described above can be used alone or in combination of two or more thereof.

<Other Components>

The adhesive layer 13 may optionally contain known additives such as fillers, pigments, diluents, anti-aging agents, and UV stabilizers. One type of additive can be used alone, or two or more types thereof may be used in combination.

[Method for Production of Pellicle]

The production method according to the present embodiment provides:

a method for the production of the pellicle 5, wherein
when the attachment portion S1 of the adhesive layer 13 to the photomask 4 is irradiated with Xe excimer lamp light from a back surface of the photomask 4 for 2 minutes and the pellicle 5 is then peeled off, the residual ratio of the adhesive layer 13 is 0.001 to 5.0%.

Such a production method can include, for example, the following steps.

First step: a step of obtaining a precursor composition for the adhesive layer 13.

Second step: a step of applying the obtained precursor composition to the frame 12.

Third step: a step of drying the applied precursor composition to obtain the adhesive layer 13.

In the first step, components (A) and (B) are mixed to obtain a precursor composition for the adhesive layer 13. The component (A) and/or the component (B) may be mixed as-is, or may be diluted with a predetermined solvent and then mixed. The precursor composition may further contain a solvent from the viewpoint of controlling the applicability to the frame 12 and/or the thickness of the resulting adhesive layer 13. Examples of these solvents include, but are not limited to, acetone, ethyl acetate, butyl acetate, and toluene.

As described above, various physical properties of the adhesive layer 13 can be controlled by the types and/or ratios of the components (A) and (B), and in turn, the residual ratio can be controlled.

In the second step, the obtained precursor composition is applied to the frame 12. In an embodiment, in the second step, the precursor composition is applied to the other face 12b of the frame 12. As the application method, a method using a dispenser is preferable. At this time, the viscosity of the precursor composition may be 1 P·s or more, or 2 P·s or more, and may be 5 P·s or less, 4 P·s or less, or 3 P·s or less. The viscosity here is obtained at, for example, 25° C. using a B-type viscometer.

In the third step, the applied precursor composition is dried to obtain the adhesive layer 13. This third step can further include the following steps:

Third (1) step: a drying step.

Third (2) step: a molding step.

In the third (1) step, the applied precursor composition is dried to reduce the amount of solvent in the precursor composition. In the third (1) step, the dried precursor composition may be heated to an extent that it can be molded. The heating time may be, for example, 50 to 10,000 seconds, and the heating temperature may be, for example, 50 to 200° C. Heat-drying may be performed on multiple occasions at different heating times or different temperatures.

In the third (2) step, the precursor composition is molded to a predetermined thickness and/or a predetermined width. In the third (2) step, the molded precursor composition may be further heated so that the curing reaction between the components (A) and (B) further proceeds.

The production method according to the present embodiment may further include the following step:

Fourth step: a step of laminating the protective film 14 on the adhesive layer 13.

In the fourth step, the protective film 14 is laminated on the adhesive layer 13. In the fourth step, after laminating the protective film 14, this state may be maintained at room temperature (20±3° C.) for several days. As a result, the adhesive force may be stabilized.

In the production method according to the present embodiment, the attachment of the pellicle film 11 to the frame 12 may be before the first step, between the first step and the second step, between the second step and the third step, between the third step and the fourth step, or after the fourth step.

[Test Method for Mask Adhesive Layer]

The test method according to the present embodiment provides:

a test method for a mask adhesive layer, wherein a value based on a residual ratio (residual area of the adhesive layer on the quartz mask/area of an attachment portion of the adhesive layer to the quartz mask) of the mask adhesive layer is compared with a predetermined threshold value. According to this method, the efficiency of the quartz mask replacement operation can be evaluated.

In the above test method, the value of the obtained residual ratio itself may be compared with the threshold value, or a value correlated with the residual ratio may be compared with the threshold value. The threshold value can be appropriately determined, and when comparing the value of the residual ratio itself with the threshold value, the threshold value is, for example, 0.001% and/or 5.0%. By the residual ratio being 0.001 to 5.0%, further efficiency of mask replacement operation is expected.

In the test method described above, the attachment portion of the mask adhesive layer to the quartz mask may or may not be irradiated with Xe excimer lamp light from the back surface of the mask. When irradiating with Xe excimer lamp light, the irradiation time is, for example, 30 seconds to 5 minutes, or 30 seconds to 2 minutes, and in an embodiment, is 2 minutes. By performing the above test assuming a normal environment and normal operation based on an actual lithographic step, it is easy to evaluate the efficiency of mask replacement operation in the actual lithographic step.

The present embodiment has been described above. The present embodiment is not limited to the above-described aspects, and various modifications can be made within the scope of the spirit thereof.

EXAMPLES

Next, the present embodiment will be described in more detail with reference to Examples and Comparative Examples.

Example 1

<Preparation of Adhesive Composition>

First, in a reaction vessel equipped with a stirrer, a thermometer, a reflux condenser, a dropping device, and a nitrogen introduction tube, ethyl acetate (30 parts by mass) and raw materials (raw materials for component (A)) listed in the table were charged and reacted for 8 hours at reflux temperature in a nitrogen atmosphere. After the reaction was complete, butyl acetate (33 parts by mass) was added thereto to obtain a solution of a (meth)acrylic acid ester copolymer (component (A)) with a nonvolatile content concentration of 37% by mass. A raw material (component (B)) listed in the table was added to 100 parts by mass of the obtained solution, and the mixture was stirred and mixed to obtain an adhesive composition.

<Preparation of Pellicle>

Using a dispenser, the adhesive composition prepared as described above was applied onto the other face of an aluminum alloy frame (outer diameter 115 mm×149 mm, inner diameter 111 mm×145 mm, height 3.0 mm) in a state in which the pellicle film was adhered to one face. The applied adhesive composition was heated in two steps (first step: 115° C., 11 minutes; second step: 150° C., 5 minutes) to obtain a mask adhesive layer (thickness 0.30 mm).

Thereafter, a 100 µm thick polyester protective film having a silicone layer formed thereon was laminated on the mask adhesive layer and cured at 100° C. for 12 hours.

From the foregoing, the pellicle of Example 1 was produced.

[Other Examples] and [Comparative Examples]

Each pellicle was produced in the same manner as in Example 1, except that the raw materials for the component (A) and the raw material for the component (B) were changed as shown in the table. Since the adhesive composition of Comparative Example 2 had poor applicability and a pellicle could not be produced, the efficiency of photomask replacement operation was not evaluated.

[Adhesive Residue Microscope Image]

Figure 3B:
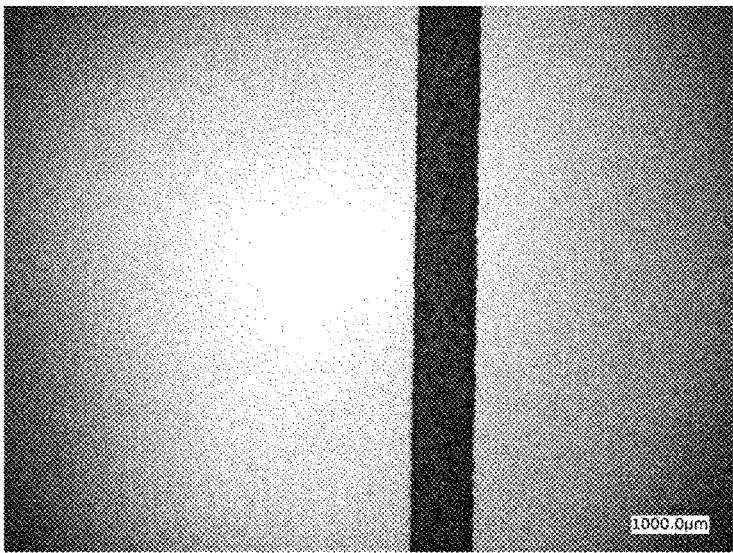

FIGS. 3A and 3B are microscope images of adhesive residue. FIG. 3A corresponds to the results in the Examples, and FIG. 3B corresponds to the results in the Comparative Examples.

<Residual Stress>

After cutting one side of the pellicle with the protective film and peeling off the protective film so as not to deform the mask adhesive layer, the mask adhesive layer was gradually peeled off from the frame. When it was difficult to peel off, Siccarol was attached to the mask adhesive layer and the mask adhesive layer was gradually peeled off. The direction of the mask adhesive layer along the length direction of the pellicle corresponds to the longitudinal direction of the mask adhesive layer, and the direction of the mask adhesive layer along the width direction of the pellicle corresponds to the short direction of the mask adhesive layer. A tension was applied to the adhesive layer in the longitudinal direction until the peeled mask adhesive layer had an elongation of 20%. After the tension was applied, the tension was kept, and 3 minutes elapsed thereafter, the residual stress value per unit cross-sectional area was determined. Calculation of the tension and residual stress values was performed with the following device under the following conditions:

Device name: Autograph (SHIMAZU EZ-S manufactured by Shimadzu Corporation)

Load cell: 1 N (clip type chuck)

Chuck interval: 10 mm

Crosshead speed: 5 mm/min

The pellicles of the Examples and Comparative Examples were evaluated according to the following criteria.

A: Residual stress value is greater than 0 and 5.0 mN/mm$^2$ or less

B: Residual stress value is greater than 5.0 mN/mm$^2$ and 10.0 mN/mm$^2$ or less C: Residual stress value is greater than 10.0 mN/mm$^2$ <Adhesive Residue>

The pellicle of each of the Examples and Comparative Examples (for pellicles with a protective film, the pellicle after peeling off the protective film) was loaded (5 kgf, 60 seconds) and attached to a photomask (6025 size, made of quartz) using a simple mounter. As a result, an exposure master having the photomask and the pellicle mounted to the photomask was obtained.

The attachment portion of the mask adhesive layer to the photomask was irradiated with Xe excimer lamp light from the back surface of the photomask for 2 minutes, and the pellicle was then peeled off from the photomask. Peeling was performed using a known tensile testing machine by pulling up the photomask perpendicularly at a rate of 5 mm/min. The surface of the photomask was observed visually and using a microscope, and the residual area of the mask adhesive layer on the photomask and, in turn, the residual ratio of the mask adhesive layer, were calculated. The pellicles of the Examples and Comparative Examples were then evaluated based on the following criteria.

A: the residual ratio is 0.001 to 2.0%

B: the residual ratio is greater than 2.0 and 5.0% or less

C: the residual ratio exceeds 5.0%

Note that the irradiation conditions for the Xe excimer lamp light are as follows.

Light source: Xe

Illuminance: 50 mW/cm$^2$

Cumulative radiation dose: 6.0 J/cm$^2$

<Efficiency of Photomask Replacement Operation>

As described above, by reducing adhesive residue, the removal operation of the mask adhesive layer remaining on the photomask can be shortened in time and/or simplified. Furthermore, as described above, by maintaining the residual stress within the criterion value, mask distortion caused by the mask adhesive layer can easily be reduced, whereby the photomask can easily be reused. Thus, the pellicles of the Examples and Comparative Examples were evaluated based on the following criteria.

A: "Adhesive residue" is rated A and "residual stress" is rated A

B: "Adhesive residue" is rated A or B and "residual stress" is rated B or C

C: "Adhesive residue" is rated C

TABLE 1

| | Component (A) | | Component (B) | | Adhesive residue | Residual stress | Efficiency of photomask replacement |
| --- | --- | --- | --- | --- | --- | --- | --- |
| | Polymer | Ratio | Curing agent | Content (% by mass) | (irradiation time: 2 mins) | value (mN/mm²) | operation |
| Ex 1 | BuA/HEA | 99/1 | TPA-100 | 0.80 | A | A | A |
| Ex 2 | BuA/HEA | 99/1 | TPA-100 | 0.40 | A | A | A |
| Ex 3 | BuA/HEA | 99/1 | E402-80B | 0.60 | A | A | A |
| Ex 4 | BuA/HEA | 99/1 | MHG-80B | 1.00 | A | B | B |
| Ex 5 | BuA/HEA | 97/3 | Coronate L | 0.38 | A | C | B |
| Comp Ex 1 | BuA/HEA | 99/1 | Coronate L | 0.38 | C | A | C |
| Comp Ex 2 | BuA/HEA | 99/5 | Coronate L | 0.38 | — | — | — |

BuA: Butyl acrylate
HEA: Hydroxyethyl acrylate
Duranate TPA-100 (manufactured by Asahi Kasei Corporation)
Duranate E402-80B (manufactured by Asahi Kasei Corporation)
Duranate MHG-80B (manufactured by Asahi Kasei Corporation)
HCoronate L (manufactured by Tosoh Corporation)

As confirmed from the table, the pellicles of the Examples were evaluated as passing in both "adhesive residue" and "residual stress." Thus, by using the pellicles of the Examples, it is expected that the photomask replacement operation will be made more efficient.

INDUSTRIAL APPLICABILITY

The present invention can suitably be applied in relation to a lithography step for obtaining electronic parts such as integrated circuits (IC), large-scale integration (LSI), and LCD displays (liquid crystal displays). The present invention can suitably be applied to the fields of pellicles, exposure masters, exposure devices, pellicle production methods, and mask adhesive layer test methods.

DESCRIPTION OF REFERENCE SIGNS

1: exposure device
2: exposure master
3: light source
4: photomask (quartz mask)
5: pellicle
6: stage
11: pellicle film
12: frame
12A: side (long side)
12B: side (short side)
12a: one face
12b: other face
12c: inner circumferential face
12d: outer circumferential face
13: adhesive layer (mask adhesive layer)
14: protective film
Op: opening

The invention claimed is:
1. A pellicle, comprising a frame on which a pellicle film is placed and a mask adhesive layer which is placed on the frame, wherein
    when an attachment portion of the adhesive layer to a quartz mask is irradiated with xenon (Xe) excimer lamp light from a back surface of the mask for 2 minutes and the pellicle is then peeled off, a residual ratio of the adhesive layer represented as a ratio of residual area of the adhesive layer on the mask to area of the attachment portion of the adhesive layer is 0.001 to 5.0%, the adhesive layer comprises:
    a reaction product of an acrylic- or methacrylic-copolymer and a curing agent having a crosslinking density-ensuring unit and a flexibility-imparting unit,
the crosslinking density-ensuring unit contains three or more isocyanate groups, and
the flexibility-imparting unit contains an aliphatic isocyanate compound containing an isocyanate group located at an end of an alkyl chain having 4 or more carbon atoms.
    2. The pellicle according to claim 1, wherein the residual ratio when the attachment portion is irradiated with xenon (Xe) excimer lamp light from the back surface of the mask for 2 minutes and the pellicle is then peeled off is 5.0% or less.
    3. The pellicle according to claim 1, wherein the residual ratio is 2.0% or less.
    4. The pellicle according to claim 1, wherein when a tension is applied to the adhesive layer in a longitudinal direction at an elongation of 20% and thereafter the tension is kept, and 3 minutes has elapsed, a residual stress value per unit cross-sectional area is greater than 0 and 10 mN/mm² or less.
    5. The pellicle according to claim 1, wherein the adhesive layer comprises:
    a reaction product of the acrylic-copolymer and a curing agent having a crosslinking density-ensuring unit and a flexibility-imparting unit.
    6. The pellicle according to claim 5, wherein the acrylic-copolymer contains a hydroxyl group-containing monomer, and
    a ratio of the hydroxyl group-containing monomer to a total amount of the acrylic-copolymer is 4.0% by mass or less.
    7. The pellicle according to claim 5, wherein 95% by mass or more of the curing agent is an aliphatic isocyanate compound.
    8. The pellicle according to claim 5, wherein less than 5% by mass of the curing agent is an aromatic isocyanate compound.
    9. The pellicle according to claim 5, wherein a ratio of the curing agent to a total amount of the acrylic-copolymer is 0.20 to 3.00% by mass.
    10. An exposure master comprising a quartz mask and the pellicle according to claim 1 mounted to the mask.

11. An exposure device, comprising:
a light source for emitting xenon (Xe) excimer lamp light, and
the exposure master according to claim 10, which is irradiated with the xenon (Xe) excimer lamp light.

12. A method for the production of a pellicle comprising a frame on which a pellicle film is placed and a mask adhesive layer which is placed on the frame, wherein
when an attachment portion of the adhesive layer to a quartz mask is irradiated with xenon (Xe) excimer lamp light from a back surface of the mask for 2 minutes and the pellicle is then peeled off, a residual ratio of the adhesive layer represented as a ratio of residual area of the adhesive layer on the mask to area of the attachment portion of the adhesive layer is 0.001 to 5.0%,
the adhesive layer comprises:
a reaction product of an acrylic- or methacrylic-copolymer and a curing agent having a crosslinking density-ensuring unit and a flexibility-imparting unit,
the crosslinking density-ensuring unit contains three or more isocyanate groups, and
the flexibility-imparting unit contains an aliphatic isocyanate compound containing an isocyanate group located at an end of an alkyl chain having 4 or more carbon atoms.

13. A test method of an adhesive layer for a mask, using a pellicle comprising a frame on which a pellicle film is placed and a mask adhesive layer which is placed on the frame, wherein
acceptability of the adhesive layer is determined by whether or not a residual ratio of the adhesive layer represented by a ratio of residual area of the adhesive layer on a quartz mask/area of an attachment portion of the adhesive layer to the mask is within a range of 0.001% to 5.0%, the adhesive layer comprises:
a reaction product of an acrylic- or methacrylic-copolymer and a curing agent having a crosslinking density-ensuring unit and a flexibility-imparting unit,
the crosslinking density-ensuring unit contains three or more isocyanate groups, and
the flexibility-imparting unit contains an aliphatic isocyanate compound containing an isocyanate group located at an end of an alkyl chain having 4 or more carbon atoms.

14. A pellicle, comprising a frame on which a pellicle film is placed and a mask adhesive layer which is placed on the frame, wherein
when an attachment portion of the adhesive layer to a quartz mask is irradiated with xenon (Xe) excimer lamp light from a back surface of the mask at a cumulative radiation dose of 6.0 $J/cm^2$ and the pellicle is then peeled off, a residual ratio of the adhesive layer represented as a ratio of residual area of the adhesive layer on the mask/area of the attachment portion of the adhesive layer is 0.001 to 5.0%,
the adhesive layer comprises:
a reaction product of an acrylic- or methacrylic-copolymer and a curing agent having a crosslinking density-ensuring unit and a flexibility-imparting unit,
the crosslinking density-ensuring unit contains three or more isocyanate groups, and
the flexibility-imparting unit contains an aliphatic isocyanate compound containing an isocyanate group located at an end of an alkyl chain having 4 or more carbon atoms.

* * * * *